United States Patent [19]
Yamamura

[11] Patent Number: 5,341,096
[45] Date of Patent: Aug. 23, 1994

[54] SEMICONDUCTOR INTEGRATED CIRCUIT HAVING A SCAN CIRCUIT PROVIDED WITH A SELF-CONTAINED SIGNAL GENERATOR CIRCUIT

[75] Inventor: Takeshi Yamamura, Zama, Japan

[73] Assignee: Fujitsu Limited, Kanagawa, Japan

[21] Appl. No.: 89,628

[22] Filed: Jul. 12, 1993

Related U.S. Application Data

[63] Continuation of Ser. No. 550,845, Jul. 10, 1990, abandoned.

[30] Foreign Application Priority Data

Jul. 11, 1989 [JP] Japan .................................. 1-178307

[51] Int. Cl.$^5$ ...................... G01R 31/28; G06F 11/00
[52] U.S. Cl. ................... 324/765; 324/73.1; 371/22.3
[58] Field of Search .................... 324/158 R, 73.1; 371/15.1, 22.3, 22.6, 25.1, 22.1, 22.2; 437/8; 307/480, 443, 303.1

[56] References Cited

U.S. PATENT DOCUMENTS

| 4,278,897 | 7/1981 | Ohno et al. | 307/307 |
| 4,894,830 | 1/1990 | Kawai | 371/22.3 |
| 4,912,395 | 3/1990 | Sato et al. | 371/22.3 |

FOREIGN PATENT DOCUMENTS

| 164209 | 6/1985 | European Pat. Off. |
| 292136 | 4/1988 | European Pat. Off. |
| 252714 | 9/1988 | European Pat. Off. |

OTHER PUBLICATIONS

"Tab Design With Burn-in Feature", IBM Technical Disclosure Bulletin, 700, vol. 31, No. 5, Oct. 1988.
"Technique For a Dynamic Burn-in Test", IBM Technical Disclosure Bulletin, vol. 32, No. 8B, Jan. 1990.
"A Fully Integrated Design Methodology for 100K--Gate CMOS Custom LSIs With Tab Packaging", IEEE 1989 Custom Integrated Circuits Conference.
"Design For Testability and Built-in Self Test: A Review", IEEE Transactions of Industrial Electronics, vol. 36, No. 2, May 1989.
"Digital Logic Testing and Simulation", Alexander Miczo, 1986, Harper & Row, Publishers, Inc., New York, pp. 276-280.

*Primary Examiner*—Vinh Nguyen
*Attorney, Agent, or Firm*—Nikaido, Marmelstein, Murray & Oram

[57] ABSTRACT

A semiconductor integrated circuit device in which a scan circuit is self-contained, is adapted to implement a dynamic burn-in test within an LSI device. The device includes an internal circuit provided in an LSI chip; a scan circuit for delivering scan data into the internal circuit; scan data generation circuit for generating scan data corresponding to a test mode signal; and a clock generation circuit for generating scan clocks corresponding to the test mode signal. In the internal circuit, the scan circuit, the scan data generation circuit and the clock generation circuit are arranged in the LSI chip. Corresponding to the test mode signal, data produced by the scan data generation circuit is delivered to the scan circuit.

10 Claims, 15 Drawing Sheets

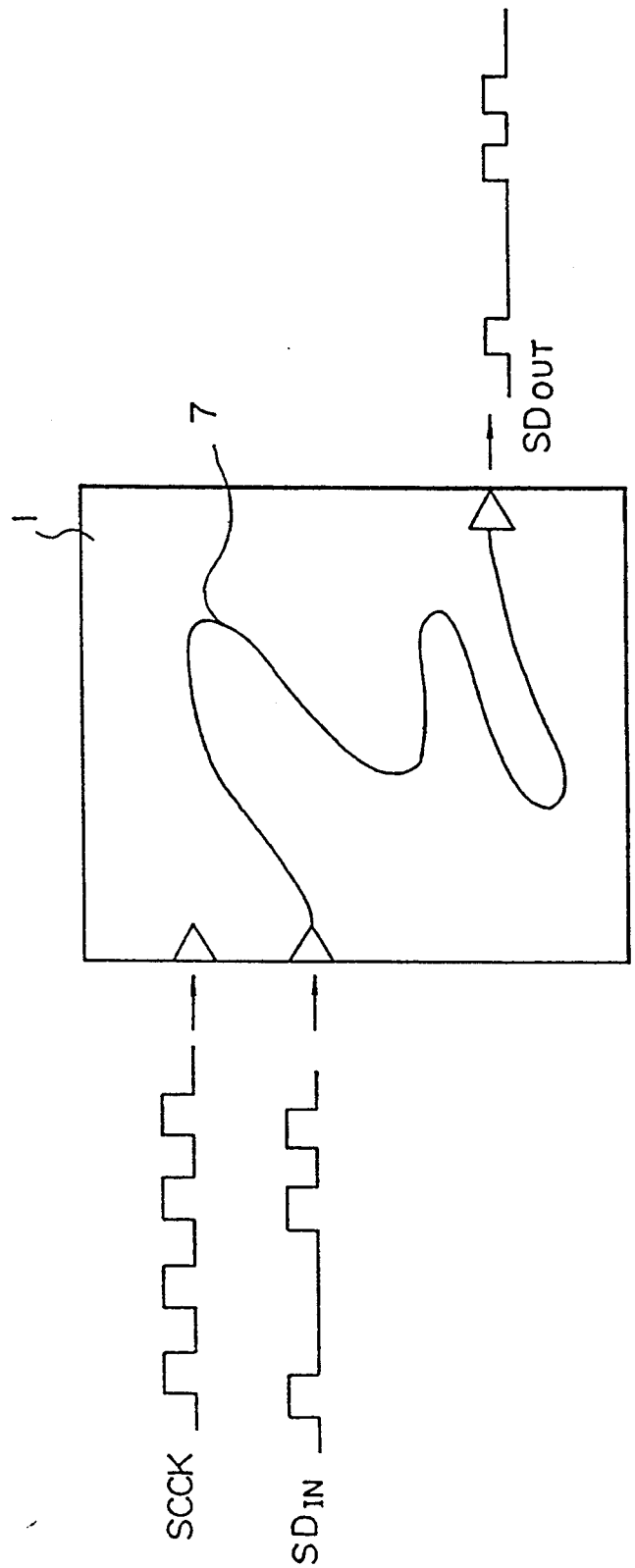

Fig. 7

| Q1 | Q2 | Q3 |
|---|---|---|
| 1 | 1 | 1 |
| 1 | 0 | 1 |
| 1 | 0 | 0 |
| 0 | 1 | 0 |
| 0 | 0 | 1 |
| 1 | 1 | 0 |
| 0 | 1 | 1 |

| 1 | 1 | 1 |
|---|---|---|
| ⋮ | ⋮ | ⋮ |

Fig. 12(a)
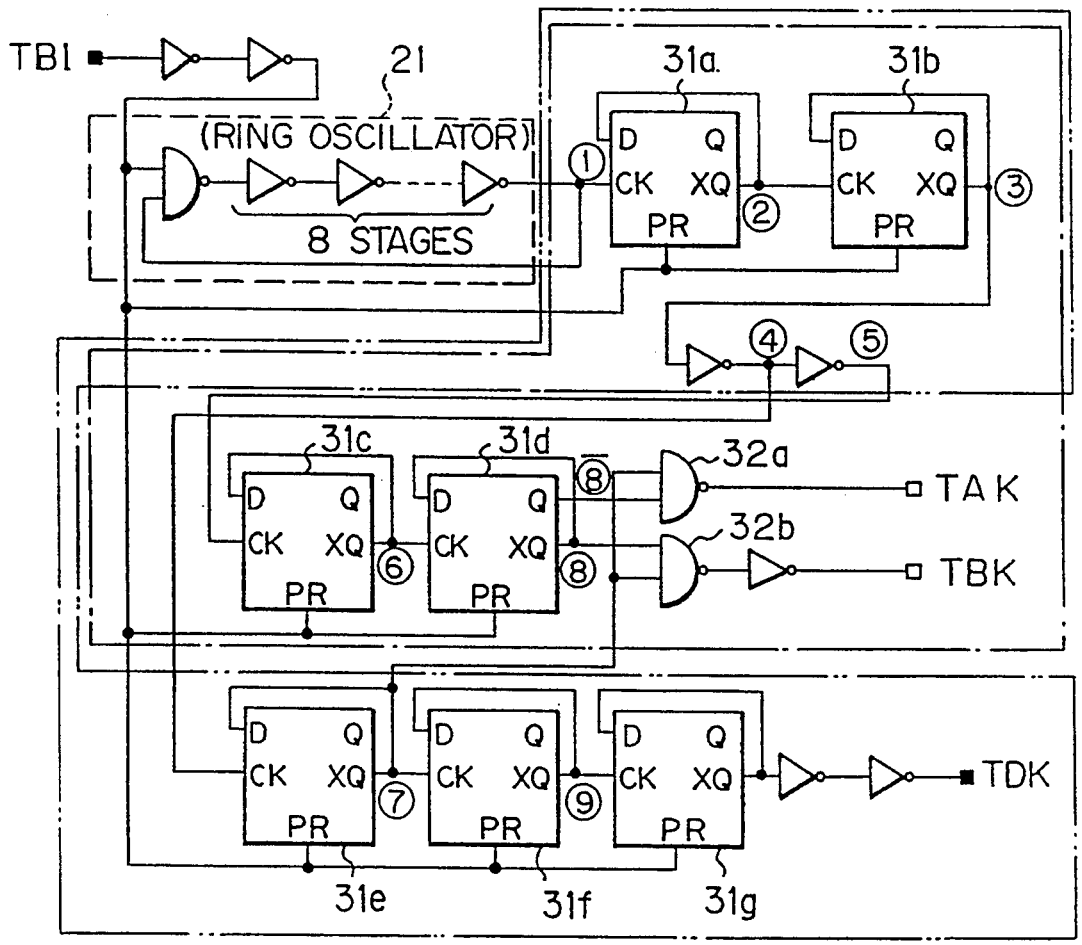
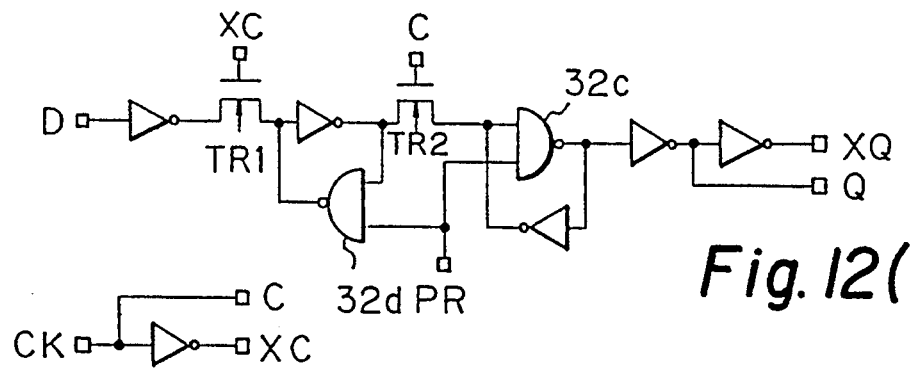
Fig. 12(b)
Fig. 12(c)

SEMICONDUCTOR INTEGRATED CIRCUIT HAVING A SCAN CIRCUIT PROVIDED WITH A SELF-CONTAINED SIGNAL GENERATOR CIRCUIT

This application is a continuation of application Ser. No. 07/550,845 filed Jul. 10, 1990, now abandoned.

BACKGROUND OF THE INVENTION

1.

This invention relates to a semiconductor integrated circuit device in which a scan path circuit is self-contained and, more particularly, to a semiconductor integrated circuit device which is adapted to implement a dynamic burn-in test within an LSI device.

With the advent of more advanced minute and precise techniques and with the high integration of LSI circuits, testing of internal circuits for conformity to design is more difficult. It is therefore important to implement a burn-in test for an LSI before shipping to reject initially defective goods and to improve the reliability of products. Especially, a dynamic burn-in test which can be carried out during operation of an LSI is important.

2. Description of the Related Arts

A scan system has been previously proposed as a test method for an internal portion of a large-scaled integration circuit device.

Some examples of the scan system are illustrated in FIGS. 1 to 5. In this scan system, all or several selected flip-flops 3 are connected to each combined internal circuit 2 in an LSI device 1 and a scan-path circuit 7 in which the flip-flops 3 are connected in series in a test mode to form a shift register, is prefabricated in the course of manufacturing LSIs.

In FIG. 1, in a test mode, test data (regarded as scan-in data) $SD_{IN}$ is scanned-in in synchronization with a scan clock SCCK to arbitrarily determine an internal data state in a shift register. When an operator wants to know an internal active state, a system clock SYSCK is stopped to prohibit a change in the internal active state and the internal data is scanned out serially from a shift register by a series of scan clocks. The scanned-out data $SD_{out}$ is compared with an expected value produced by a previous simulation to test an occurrence of failure.

FIG 2(b) shows an example of a scan chain combination circuit, wherein flip-flops FF1, FF2 and FF3 form a scan path circuit. An output $D_{OUT}$ of flip-flop FF1 is input to a combined circuit 2, an output of which is sent to an input $D_{IN}$ of flip-flop FF2. An output of flip-flop FF3 is input to the combination circuit 2, to thus receive an output of the combination circuit as an input.

A test utilizing a scan path corresponds to a scan clock SCCK from an external portion of a chip, to input a test pattern as an input $SD_{IN}$ in sequence to the flip-flops (FF1, FF2, FF3). Thereafter, test patterns are input to the combination circuit 2 simultaneously from flip-flops (FF1, FF2, FF3), and a result of the output is held in each flip-flop FF2, FF3. Then a scan clock SCCK is input to output the data held in the external portion of a chip as $SD_{OUT}$.

Alexander Miczo discloses a scan path circuit by his book (For example, "Digital Logic Testing and Simulation", Harper & Row Publishers Inc.,). A more advanced scan system using a level-sensitive scan design (LSSD) which can test AC performance, is well known. (For example, refer to ibid, pp. 276–280, and FIG. 7.20)

A still further development has been made in a boundary scan system as shown in FIGS. 3, 4 and 5.

FIG. 5 shows a method of boundary scanning, to verify a connection and a wiring state between a plurality of LSIs on a board, and FIGS. 3 and 4 show a constitution of an I/O cell provided with a function necessary to be applied to the boundary scan method shown in FIG. 5.

An LSI is generally mounted on a printed circuit board (abbreviated by PCB) to implement a system function in association with other LSIs.

As shown in FIG. 5, an LSI (1a) and an LSI (1b) are mounted on a printed circuit board (PCB 6) and the space between the LSI (1a) and the LSI (1b) is connected by a distribution cable 5 on the printed circuit board PCB 6. A prior art boundary scan system provides a method for detecting a fault such as a short-circuit or a disconnection or the like in the wiring 5 in FIG. 5.

FIG. 4 shows an LSI (1a or 1b) of FIG. 5, to be utilized in a boundary scan method. The above-mentioned scan data ($SD_{IN}$) is input from each I/O call 26 to which scan data can be input. The scan data is transferred to the nearest I/O call 26, in the order shown by each arrow path 7b. As is shown by a broken line, which is the resultant path, scan data ia transferred and is output from the last I/O cell to the exterior of the LSI, as $SD_{out}$.

FIG. 3 illustrates a circuit within the I/O call 26 of FIG. 4. Each boundary scan flip-flop 19 within each I/O cell 26 together forms a scan chain, and in accordance with a scan clock SCCK, an output state of a boundary scan flip-flop 19 in a prior stage of the I/O cell 26 is held, and data D is held in response to a clock CK. A selector 17 selects either of an output A from an internal circuit and an output B of a boundary scan flip-flop 19, and an output buffer 16 produces an output C selected from the selector 17 by a signal $\phi$.

In a normal operation of the LSI, the selector 17 selects an A side output, to produce an output A of the internal circuit at an external terminal.

In a boundary scan test, the selector 17 selects a B side output, to produce an output B of the boundary scan flip-flop at an external terminal. Under such circumstances, corresponding to an input of scan clocks SCCK, a sequence of scan data $SD_{IN}$ is transferred to the scan chain, in order to carry out a buffer operation of the output buffer 16, and thus it is possible to produce an output of the boundary scan flip-flop 19 at an external terminal. Further, if a clock CK is input, it is possible to again hold an output state of the boundary scan flip-flop 19.

A brief description of such a detection method will be provided hereinafter.

First, data is latched by serial-shifting data to I/O cells 26a and 26b in the LSI 1a and LSI 1b through boundary scan chains 7b-c, 7b-a, and 7b-b. Then, data is transferred from the LSI 1a to the LSI 1b through wiring 5. In more detail, data is transferred from the I/O cell 26a to the I/O cell 26b. Finally, data of the I/O cell 26a and I/O cell 26b is read out serially through the scan chains 7b-c, 7b-a and 7b-b. In this case, if a fault occurs in the wiring 5, the data read from the I/O cell 26b is different from the expected value.

Other than the object of using the above-described scan system for detecting a wiring failure on a printed circuit board, the system can also be applied to an implementation of a dynamic burn-in test. The burn-in test as described hereinbefore is carried out in a high temperature environment, in order to detect any initial failures and to improve reliability. In a conventional test, there is a static burn-in test for applying a D.C. bias to an LSI and a dynamic burn-in test for activating an LSI. The dynamic burn-in test for operating an LSI is more effective at detecting initial failures and is more advantageous in that the higher the operating performance is, the more conspicuously the effect is enhanced.

In a conventional example, as shown by an LSI in FIG. 1 in which a scan circuit is self-contained therein, a method is adopted in which a scan clock SCCK and scan data $SD_{in}$ may be supplied from an external source for improving the operating performance of an LSI in a dynamic burn-in test. However, in the conventional example, only an internal scan circuit is activated and a boundary scan circuit is inactive.

If the above scan circuit is utilized to implement a dynamic burn-in scheme, an external supply of scan data or scan clocks is devised and as a result of this procedure, the following problems will occur.

First, it is necessary to provide a driver for supplying a scan clock SCCK and scan data $SD_{IN}$ into an LSI device, so that a test device becomes more complicated.

Second, with respect to the drive capacity of a driver, the operating frequency is limited and the fault detection rate is reduced. This results from the fact that the operating frequency reduces and the current flowing through an LSI device drops. The larger the amount of current flowing through an LSI device is, the more the fault detection rate is enhanced.

Third, a test board or a burn-in board for supplying testing signatures into a LSI device is made of a multi-layer type board and a configuration of the device is more complicated and expensive.

Fourth, since an input pin for signals other than scan data and scan clocks in an LSI device is fixed at a HIGH or LOW state, the operation efficiency of an internal gate is reduced in comparison with a case where data is delivered into an LSI device through an input pin. Especially, when a memory circuit is self-contained and an address, data input, control terminal (for write-enable) signals and clocks are delivered directly through an input pin of an LSI device, the memory circuit does not operate at all, even if the input is fixed at a HIGH or LOW state.

Fifth, a layout position of input pins or the like for a scan clock and scan data is fixed to be able to use a burn-in board in common.

It is an object of the present invention to solve the above conventional problems and to provide a semiconductor integrated circuit device for implementing a burn-in test in an LSI using itself as a test object.

SUMMARY OF THE INVENTION

In accordance with a feature of the present invention, there is provided a semiconductor integrated circuit device comprising: an internal circuit provided in an LSI chip; a scan path means for delivering scan data into the internal circuit; scan data generation circuit for generating scan data corresponding to a test mode signal; and a clock generation circuit for generating scan clocks corresponding to the test mode signal; wherein in the internal circuit, the scan path circuit, the scan data generation means and the clock generation circuit are arranged in the LSI chip, and, corresponding to the test mode signal, data produced by the scan data generation circuit, is delivered to the scan path circuit.

In accordance with another feature of the present invention, there is provided a test method for a semiconductor integrated circuit device having scan path circuit, comprising a step of producing scan data and scan clocks automatically within an LSI chip while in a test mode; a step of delivering the scan data and the scan clocks automatically to the scan path circuit; a step of carrying out a burn-in process by an activation of an internal circuit by the scan data delivered to the scan path circuit; and a step of discriminating whether the internal circuit defective or not after the burn-in process.

In accordance with the present invention, when a test mode signal is input from an external source into an LSI, a test control circuit delivers a control signal for a test operation into a scan data generation circuit and a scan clock circuit. The scan data generation circuit outputs scan data, while the scan clock generation circuit produces a scan clock. Scan data is delivered into a scan path circuit during one cycle of the scan clock.

As stated above, only if a test mode signal is provided externally to an LSI, is scan data generated within the LSI and a burn-in test operation is carried out through the scan path circuit.

BRIEF DESCRIPTION OF THE DRAWINGS

FIG. 1 is a diagram showing a prior art dynamic burn-in test;

FIG. 7 is a diagram showing a truth value of the generator in FIG. 6;

FIG. 12(a) is a detailed circuit diagram showing a scan data generator and a scan clock generator in FIG. 11;

FIG. 12(b) shows a detailed diagram of a flip-flop circuit of FIG. 12(a) and FIG. 12(c) shows a circuit for generating complementary clocks input to a flip-flop off FIG. 12(b);

DESCRIPTION OF THE PREFERRED EMBODIMENTS

An embodiment of the present invention will be described next with reference to the attached drawings.

Figure 8:
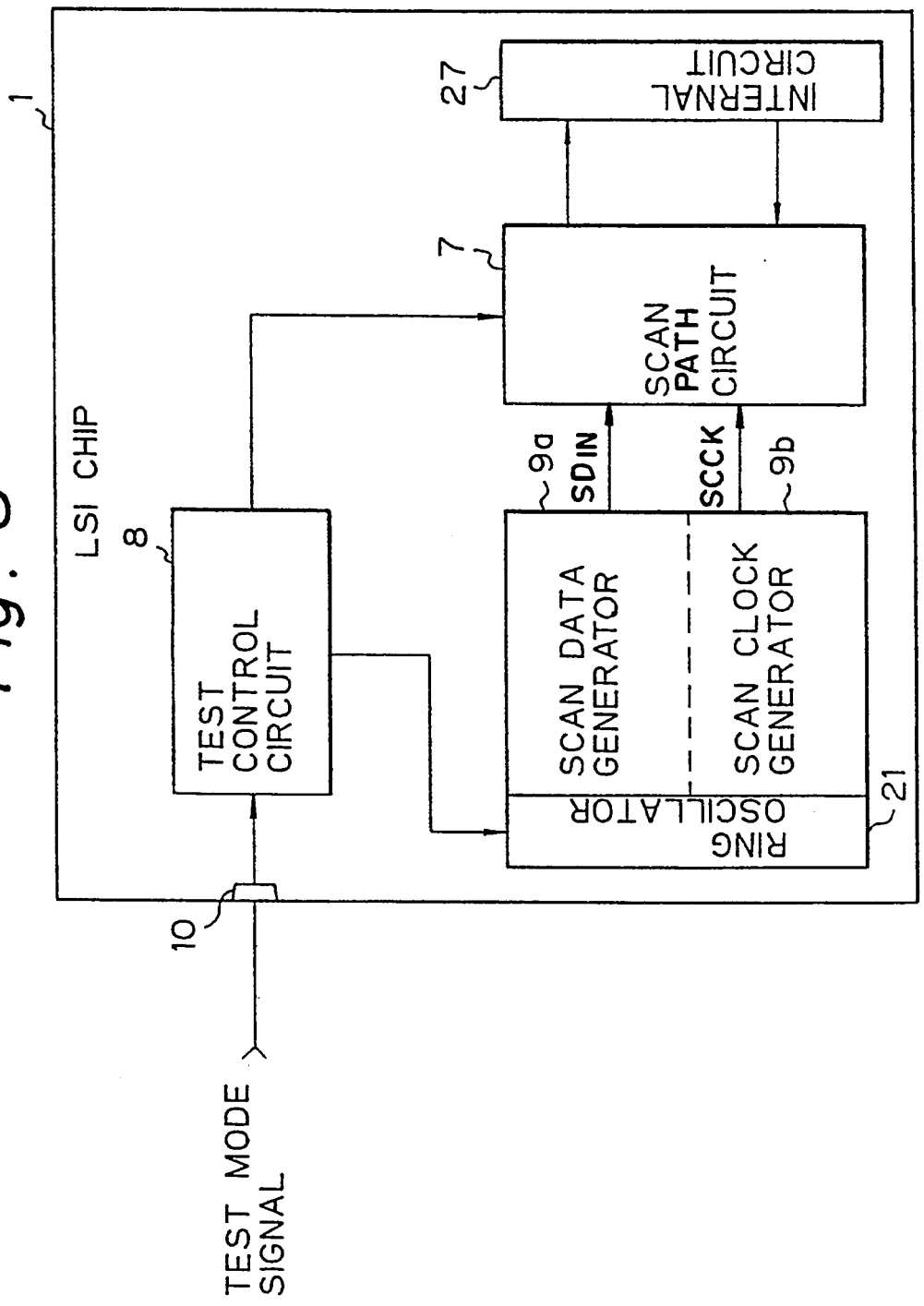
FIG. 8 is a schematic diagram showing an example of the present invention.

FIG. 8 is a schematic diagram showing a principle of the present invention.

In FIG. 8, a scan path circuit 7, a test control circuit 8, a scan data generator 9a and a scan clock generator 9b are provided within an LSI 1.

The scan path circuit 7 includes both an internal scan chain 7a and a boundary scan chain 7b (Refer to FIGS. 2–5). The scan path circuit 7 is connected to an internal circuit 27 (i.e., a general logic circuit and/or functional circuit). The internal circuit 27 inputs scan data through the scan path circuit 7 and outputs a result based on the scan data into the scan path circuit 7.

Receiving a test mode signal input from an input pin 10, a test control circuit 8 produces a selector control signal from the test control circuit 8, in order to input scan data and scan clocks output from a scan data generator 9a and a scan clock generator 9b, to the above-noted scan path circuit 7. The test control circuit 8 receives a test mode signal at an input pin 10 to offer an allowance signal for starting an operation, that is, an oscillation control signal (TBI in FIG. 12) to a basic clock generator (ring oscillator) 21.

A scan data generator 9a and a scan clock generator 9b produce scan data and scan clocks, respectively, based on a basic clock output from the basic clock generator 21.

An input pin 10 receives a test mode signal which is input in a burn-in processing mode, but does not receive scan data. A delivery of scan-in data $SD_{IN}$ to the internal scan chain 7a and the boundary scan chain 7b is carried out through a scan-in I/O cell 23, as shown in FIG. 9.

Figure 9:
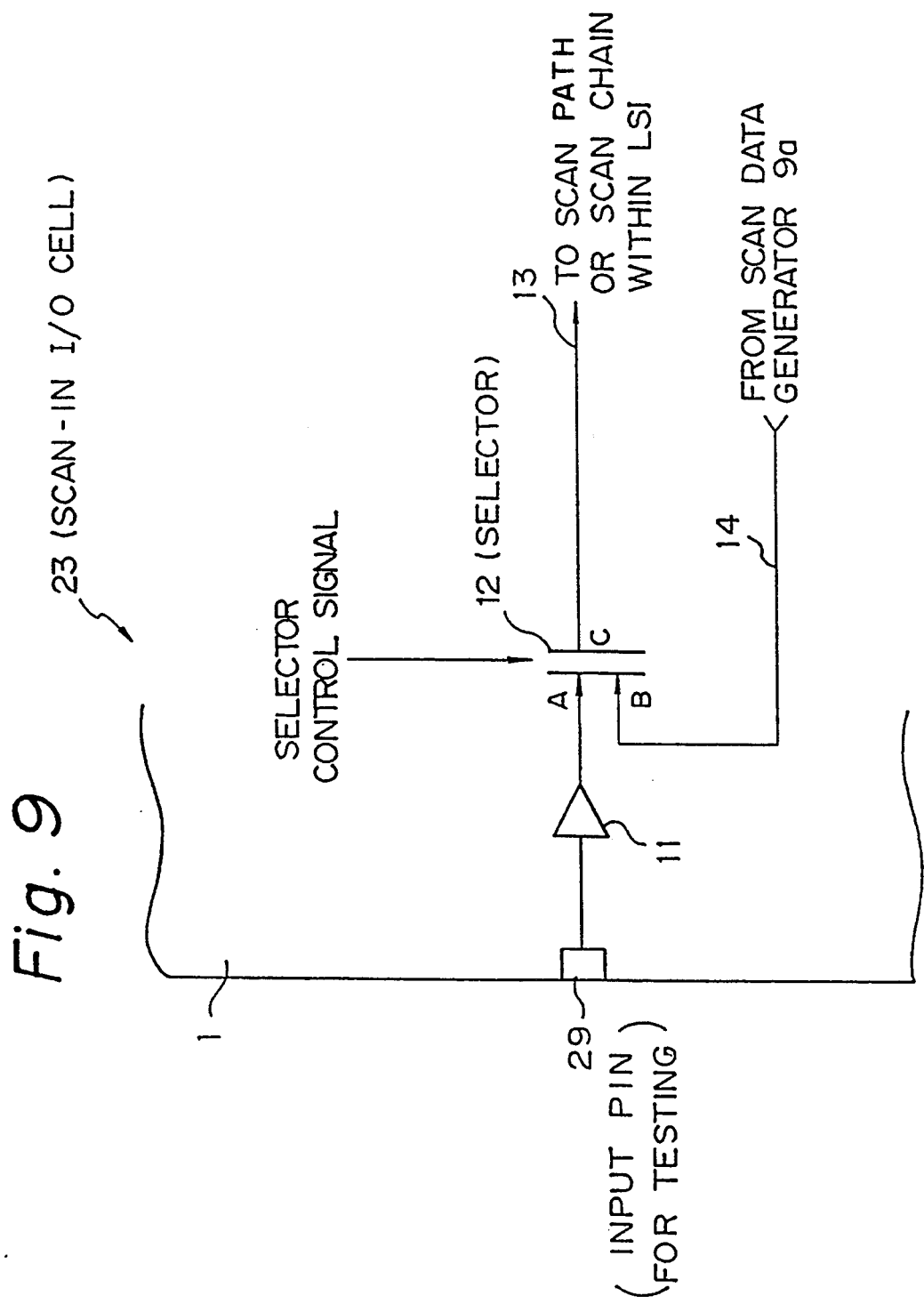
FIG. 9 is a diagram showing a scan-in I/O cell in FIG. 8.

FIG. 9 is a diagram showing a scan-in I/O cell in the present invention. FIG. 9 shows an I/O cell portion (which corresponds to an input cell $SD_{IN}$ of a scan chain 7a in FIG. 2(A)) for inputting data into a scan path circuit 7 in FIG. 2(A). An input pin 29 in FIG. 9 receives a signal different from a signal receiving at the input pin 10 in FIG. 8. When a logic state or the like of the internal circuit is verified in a conventional scan path circuit at a time other than a burn-in mode, the I/O cell in FIG. 9 receives scan data input from outward of an LSI. The scan-in I/O cell 23 is formed by an input pin 29 for testing, a buffer 11, a selector 12, and signal lines 13 and 14. In a burn-in mode, selector 12 receives a control signal from a test control circuit 8 and, through a B-C path, scan-in data is obtained from a signal line 14 and is an output of the scan data generator 9a and the scan-in data is delivered to an internal scan chain 7a through a signal line 13. A scan clock SCCK is also delivered from a scan clock I/O cell in the same way as the scan-in data $SD_{IN}$.

Figure 10:
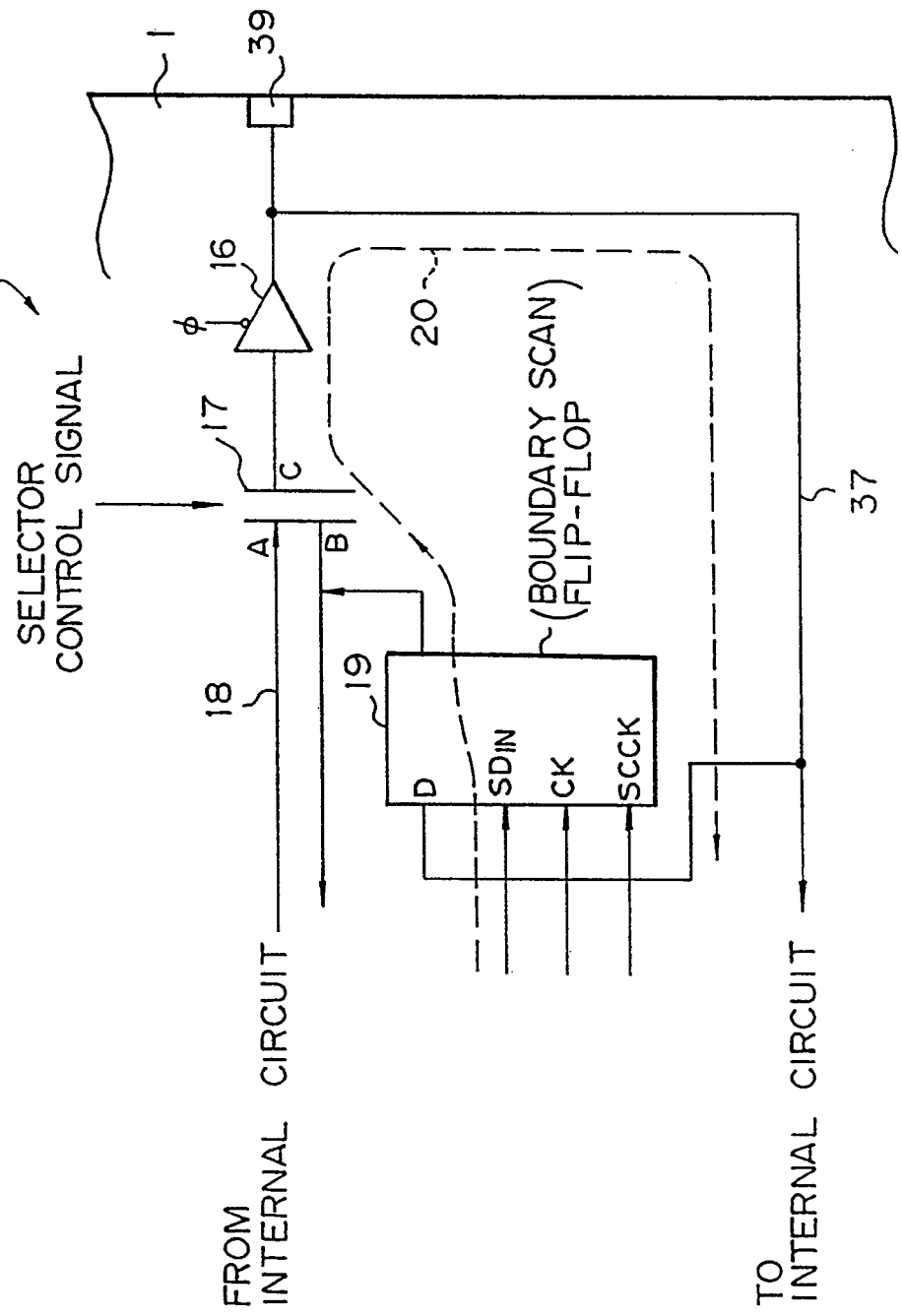
FIG. 10 is a diagram showing an embodiment of an I/O cell having a self-contained boundary scan flip-flop.

FIG. 10 is a diagram showing an I/O cell in which a boundary scan flip-flop is self-contained. The delivery of data from an input pin other than a scan-in pin to within an LSI is carried out through a boundary scan flip-flop 19 which is self-contained within an cell 24, as shown, in FIG. 10. The I/O cell 24 is associated with an input/output interface in an ordinary case to an internal circuit of LSI. That is, in an ordinary case, a selector 17 is connected to a signal line 18 side (A-C path side) and an output data from the internal circuit is output to an input/output pin 39 through a selector 17 and a tri-state buffer. On the other hand, when there is no output data from an internal circuit and the tri-state buffer is of a high impedance, an input of the external data to the internal circuit is input to the internal circuit through a signal line 37.

In a burn-in mode, receiving a selector control signal from the test control circuit 8, a B-C path is formed at the selector 17. When a boundary scan flip-flop 19 is at a first stage of boundary scan, scan data from the scan data generator 9a is input to $SD_{IN}$. The first stage of the boundary scan flip-flop 19 inputs scan data supplied to $SD_{IN}$, based on a scan clock output from the scan clock generator 9b which is supplied to the scan clock input SCCK and outputs the scan data. Then, the output scan data delivered to the internal circuit through a selector 17, a buffer, and a signal wire 37, and then, delivered to $SD_{IN}$ of scan data input in a next stage of boundary scan flip-flop 19. In a case of a boundary scan flip-flop 19 except the first stage, scan data output from the prior stage of boundary scan flip-flop 19 is input to a data input D through a signal line 37 in response to a clock CK. That is, a scan-in data $SD_{IN}$ from a scan data generator 9a is transferred serially through a boundary scan flip-flop 19 and at the same time through an output buffer 16 from a B-C path of a selector 17, delivered into an LSI from all input terminals.

Figure 14:
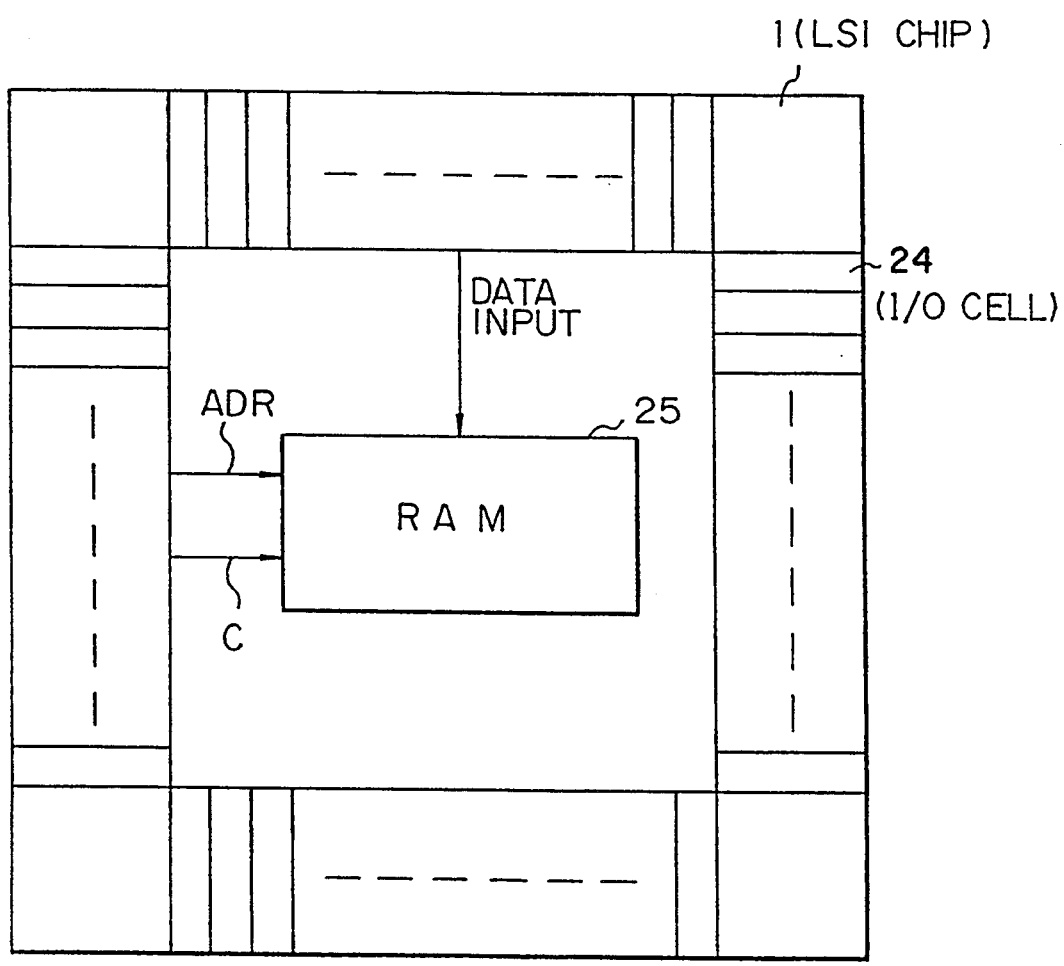
FIG. 14 is a diagram showing a delivery of signal to a self-contained memory.

As shogun in FIG. 14, a wiring is provided in a self-contained memory (RAM) 25 of the LSI 1 such that in a burn-in mode, an address signal ADR and a write-enable signal C may be directly accessible from an I/O cell 24 and a scan-in data $SD_{IN}$ is delivered from the scan data generator 9a through the I/O cell 24. If the self-contained memory is a clock-synchronized RAM, a scan clock is employed as a clock to also deliver a scan clock SCCK through the scan clock generator 9b.

Scan data of the boundary scan flip-flop 19 in FIG. 10 is input to an address (ADR) of a RAM, a write-enable signal C and data.

In order to operate the LSI 1 in the burn-in mode, it is possible to implement an input pin 10 for testing which can be set at a definite DC level.

Figure 11:
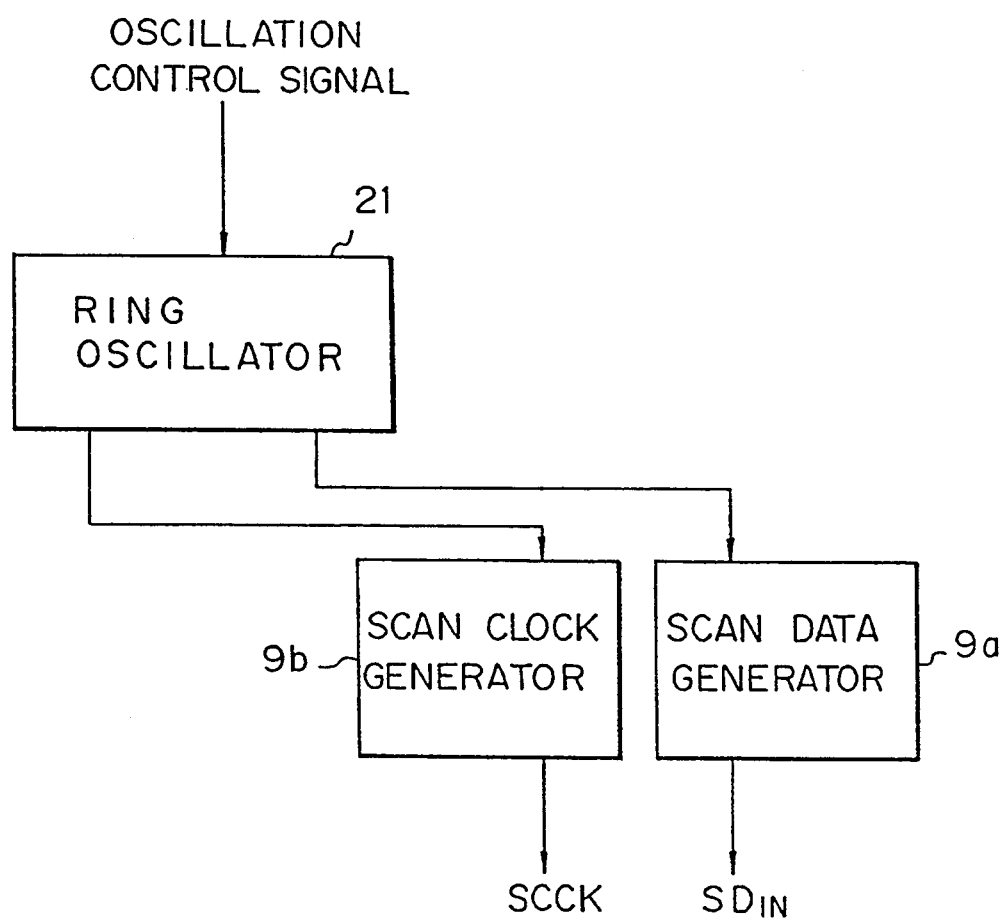
FIG. 11 is a block diagram showing a scan data generator and a scan clock generator.

FIG. 11 is a block diagram showing a scan data generator and a scan clock generator.

FIG. 12(a) is a detailed circuit diagram of a scan data generator and a scan clock generator.

Figure 13:
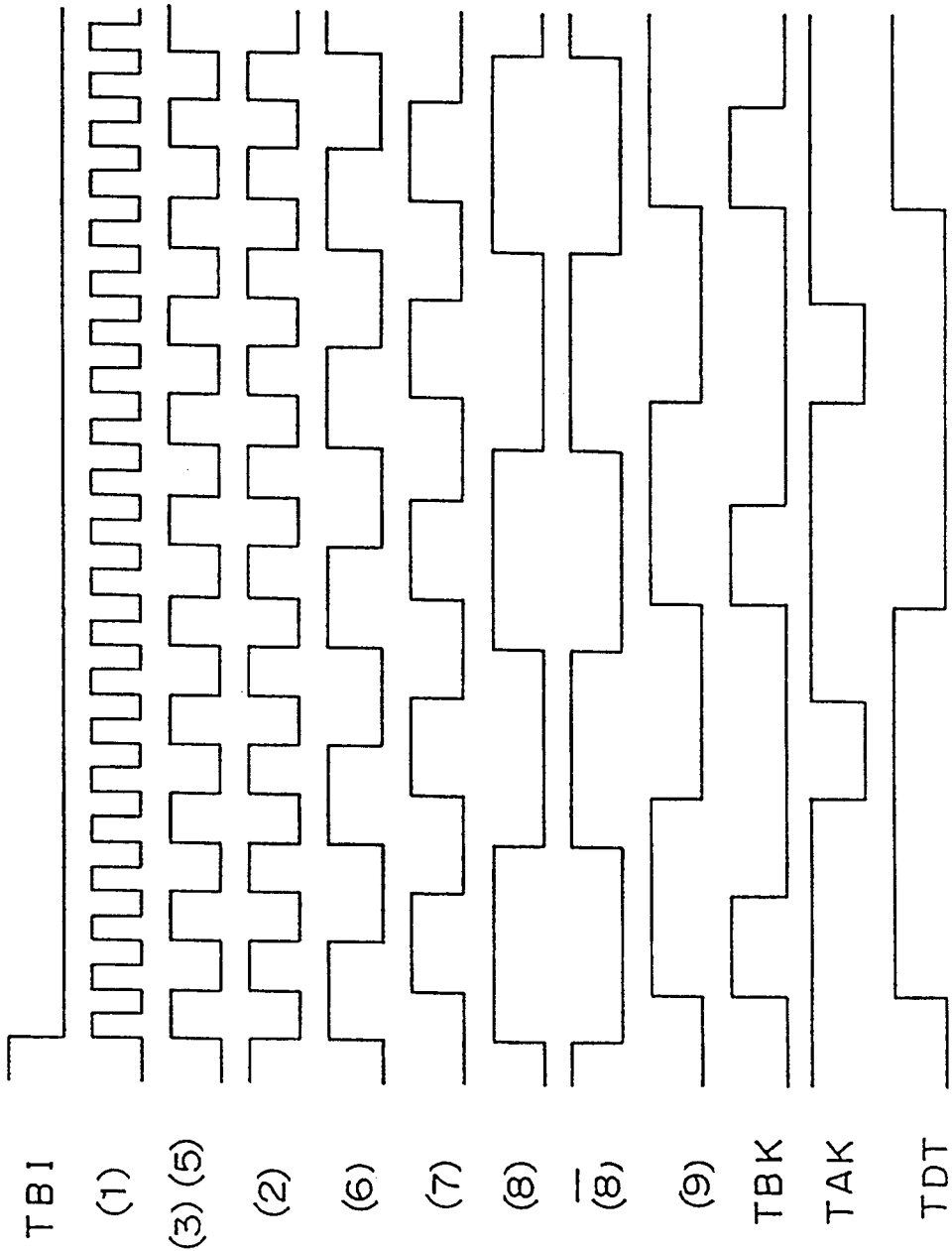
FIG. 13 is a timing chart showing an operational waveform in main parts in FIG. 11.

As shown in FIG. 11, a scan data generator 9a and a scan clock generator 9b are constituted by a ring oscillator 21. FIG. 11 corresponds to a scan data generator 9a, a scan clock generator 9b and a basic clock generator 21 for delivering a basic clock to 9a and 9b in FIG. 8. In FIG. 11, a ring oscillator is employed as a basic clock generator 21. A detailed embodiment of the circuit is illustrated in FIG. 12, and an operational waveform is shown in FIG. 13.

FIG. 12(a) is a diagram showing a detailed circuit diagram of FIG. 11.

An oscillation control signal for inputting to a ring oscillator in FIG. 11 corresponds to a signal at an input terminal (TBI) in FIG. 12(a). When the oscillation control signal is at a "LOW" level potential, the ring oscillator starts to oscillate. A scan data generator 9a is formed by flip-flops 31a, 31b, 31e, to 31g and an inverter circuit, and flip-flops 31a, 31b, 31e to 31g carries out a counter operation. A scan clock generator 9b is formed by flip-flops 31a to 31d, NAND circuits 32a and 32b for inputting outputs of flip-flops 31e and 31d, and an inverter circuit, and the flip-flops 31a to 31d carry out a counter operation.

The flip-flops 31a and 31b and two inverter circuits connected to the outputs of a flip-flop 31b are used in common with a scan data generator 9a and a scan clock generator 9b. Each complementary clock signal with a respective different phase as shown in FIG. 13 is output at each output terminal TAK, TBK, and is used, for example, as clocks a scan path circuit 7 and a boundary scan flip-flop 19. At an output terminal TDT of a scan data generator 9a, data for repeating an invention operation regularly as shown in FIG. 13 by "101 . . . " is output. The flip-flops 31a to 31g is preset, when the ring oscillator does not carry out an oscillation operation.

FIG. 12(b) and FIG. 12(c) are circuit diagram showing examples of flip-flops 31a to 31g. FIG. 12(c) is a circuit for generating complementary clocks C and CX from a clock CK input into a flip-flop.

FIG. 12(b) denotes a flip-flop circuit. The flip-flop circuit includes an inverter circuit which an input terminal is connected to a data input D, a transistor Tr1 the gate of which receives a clock CX, and a first latch portion which is formed by a NAND circuit 32d and an inverter connected to a transistor Tr1 at an input terminal; and a transistor Tr2 the gate of which receives a clock C and a second latch portion which is formed by a NAND circuit 32c and an inverter connected to a transistor Tr2 at the output terminal; and two stages of inverters connected to an output terminal of the NAND circuit 32c. In the flip-flop circuit, a preset signal is input to one input side of the NAND circuits 32c and 32d and when the preset signal is input, data stored in the first and second latch portions is made set compulsorily to an arbitrary data value.

In the flip-flop circuit, when a transistor Tr1 turns ON by a clock CX, data D to input and since a transistor Tr2 turns OFF at this time, data D is stored in only the first latch portion. Next, when a clock CK is inverted and a transistor Tr1 turns OFF and a transistor Tr2 turns ON, data D held in the above-noted first latch portion is held in the second latch portion, and data D is output to the complimentary outputs XQ and Q.

The operation of FIG. 12(a) will be described as follows with reference to FIG. 13.

As shown in FIG. 13 on TBI, when an oscillation control signal is at a "HIGH" level potential, an output terminal ① of the ring oscillator is fixed to a "LOW" level and flip-flops 31a to 31g are preset previously. When the oscillation control signal is at a "LOW" level potential, the ring oscillator starts to oscillate antomatically as shown in FIG. 13-①, and continues to oscillate for a period of "LOW" level. When the preset state of flip-flops 31a to 31g is cancelled, it leads to an activating state.

When the oscillation control signal is at a LOW level state, the scan data generator 9a and the scan clock generator 9b is operated as follows.

In both flip-flops 31a and 31b used in common with the scan data generator 9a and the scan clock generator 9b and two inverter circuits, a counter formed by flip-flops 31a and 31b responds to an oscillatory signal from the ring oscillator inputting as a clock and takes its own output signal as an input signal. From this, an output signal of a flip-flop 31a (signal ② in FIG. 13) becomes an output signal of one period for two periods of an oscillatory signal of the ring oscillator (① in FIG. 13). An output signal of a flip-flop 31b (③ in FIG. 13) also becomes an output signal of one period for two periods of an output signal of a flip-flop 31a (② in FIG. 13). Accordingly, at the output terminals of flip-flops 31a, 31b and an inverter circuit, the output signals such as ②, ③, ④ and ⑤ in FIG. 13 are output.

The scan data generator 9a produces a different phase of signal for operating a plurality of flip-flops in use for a scan path circuit 7 and a boundary scan flip-flop 19. For example, clocks (TAK, TBK) of an inversion level for not-overlapping are produced. For this reason, the output signal ⑤ of a counter formed by flip-flops 31c and 31d is input as a clock and a complementary output signals ⑧ and ⑧ (bar) which are one period for four periods of output signal ⑤, are output at an output terminal of a flip-flop 31d. NAND circuits 32a, 32b input each output signal ⑧, ⑧ (bar) at each one input terminal and input an output signal of a flip-flop 31e (⑦ in FIG. 13) which is a two-fold period of the output signal ⑧, ⑧ (bar) in common with each the other input terminal. From this, at the output of NAND circuits 32a, 32b, the output signal ⑧, ⑧ (bar) produce an output signal gated by an output signal ⑦, that is, a non-overlapped clock. Therefore, an output signal of a NAND circuits 32a is output as a clock TAK, and a clock TBK which is in an inversion relation with a clock TAK and as a result of an inversion in an inverter circuit, is output.

In the scan clock generator 9b, a test pattern which is supplied to a scan path circuit 7 and a boundary scan flip-flop 19 is produced. The scan clock generator 9b inputs an output signal ⑧ of flip-flops 31a, 31b and two inverter circuits used in common with the above-noted scan data generator 9a and a scan clock generator 9b, into a counter formed by flip-flops 31e to 31g. The output from the counter are output as a test pattern data TDT through two inverter circuits. The test pattern data TDT is a signal which the output signal ⑧ of eight periods corresponds to one period.

As described above, in a burn-in mode, receiving a test mode signal input from an input pin 10, an oscillation control signal produced from a test control circuit 8 becomes at a "LOW" level potential, then a scan data generator 9a and a scan clock generator 9b produce scan data and scan clocks automatically to deliver them to a scan path circuit 7 and a boundary scan flip-flop 19.

The regulation of an oscillating frequency can be arbitrarily carried out by an appropriate modification of a stage number (in the figure, 8 stages) of the ring oscillator 21. Alternatively, the scan-in data SD$_{IN}$ may be arbitrarily formed by a structure of the logic circuit 22.

Figure 2A:
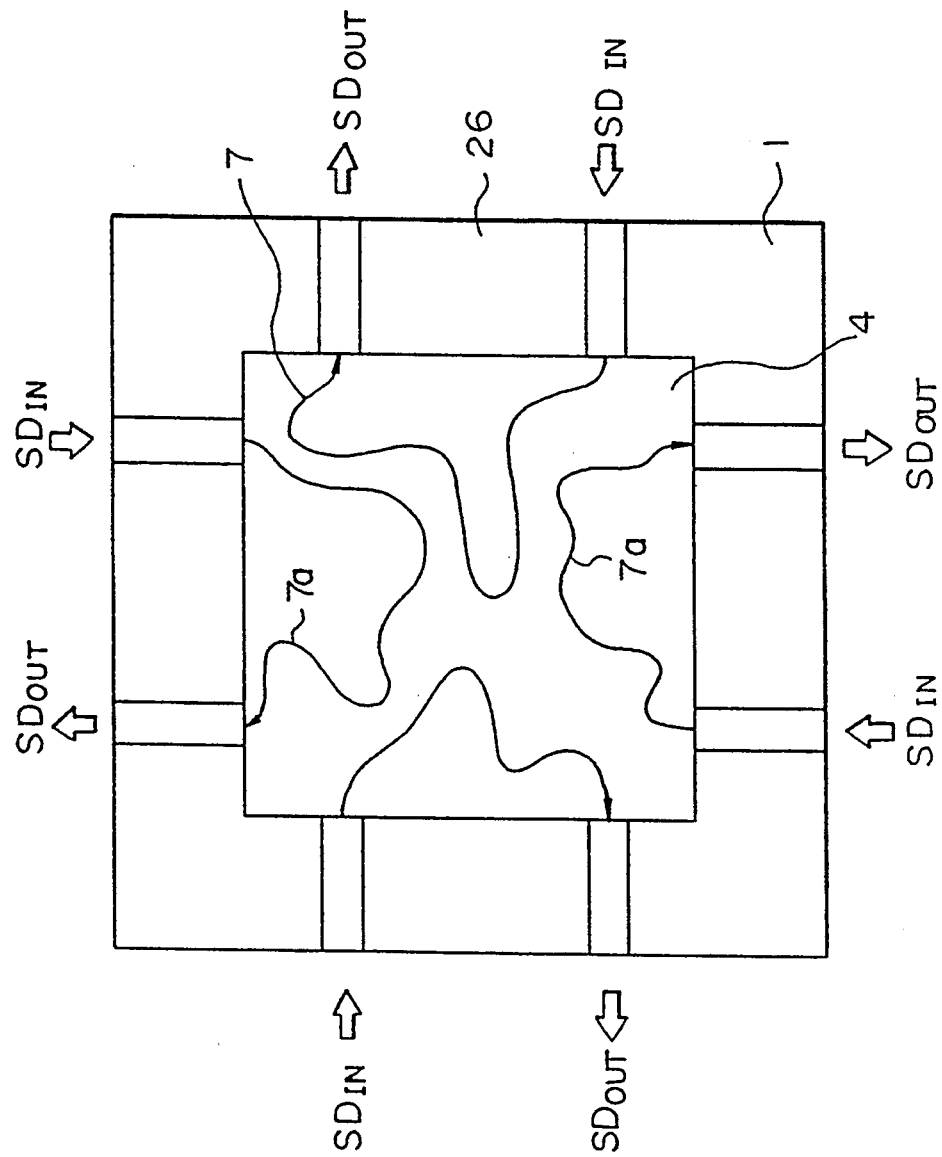
FIG. 2(A) is a schematic diagram showing an example of an internal scan chain.
Figure 2B:
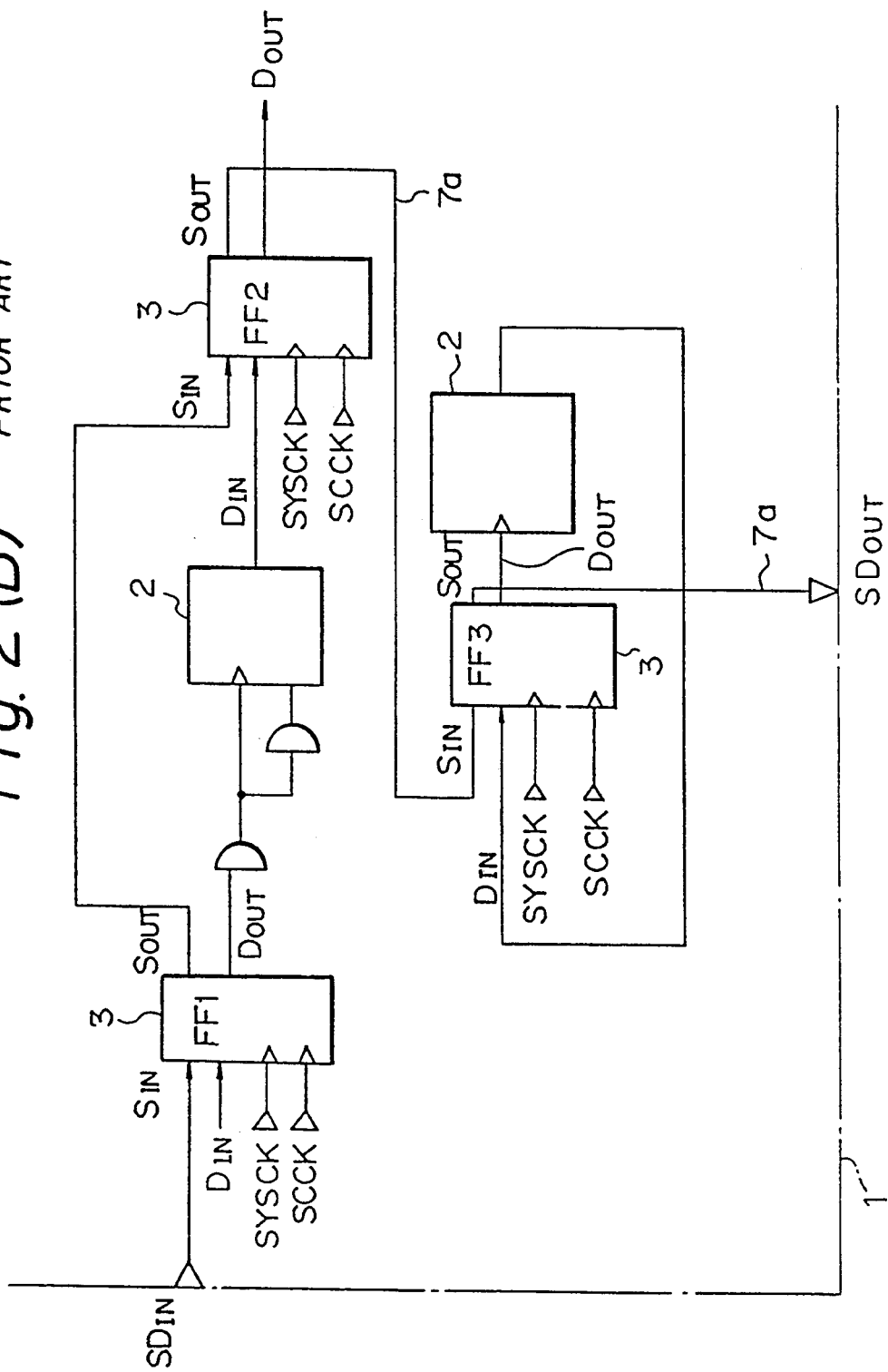
FIG. 2(B) is a block diagram showing a configuration of an internal scan chain shown in FIG. 2(A)
Figure 3:
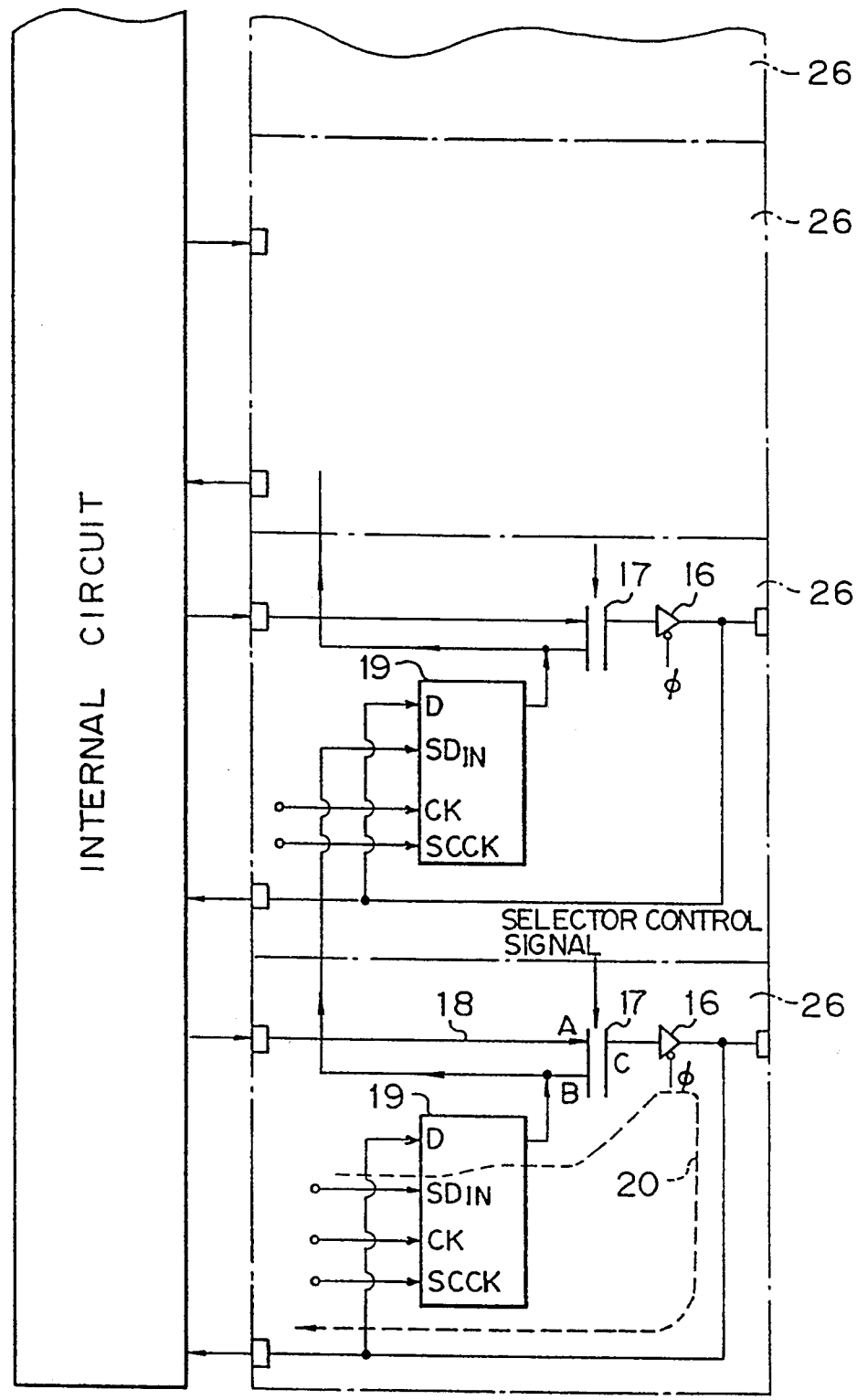
FIG. 3 is a diagram showing I/O cells in which each boundary scan flip-flop is self-contained.
Figure 4:
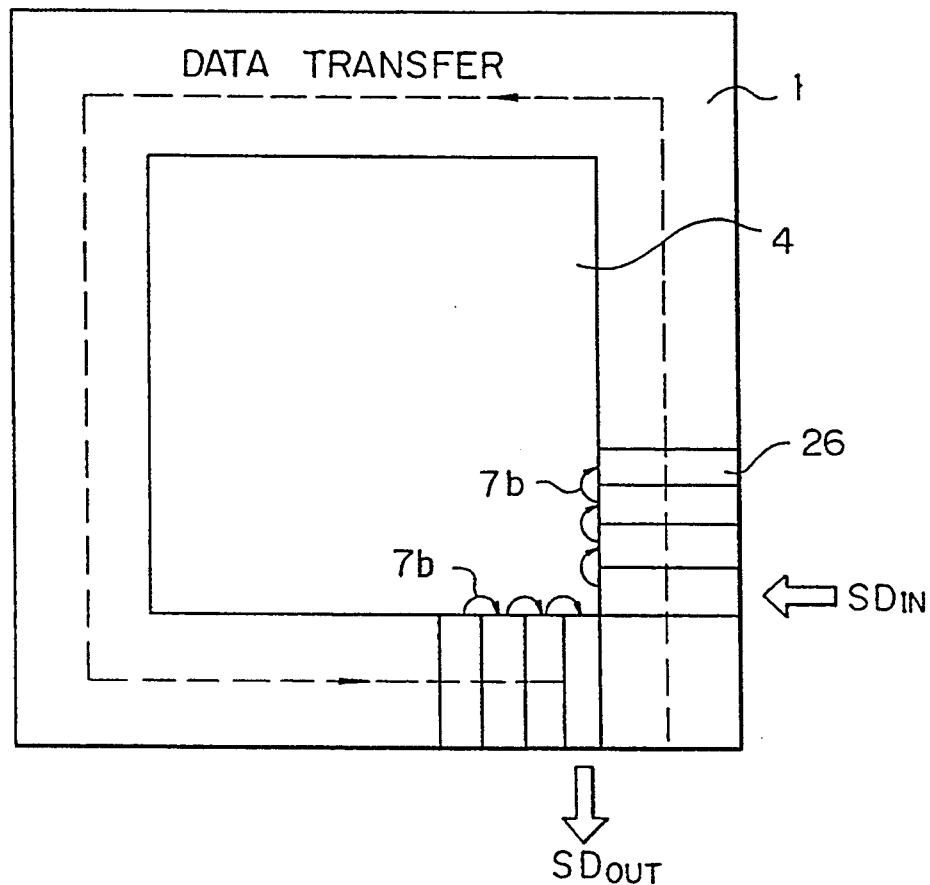
FIG. 4 is a schematic diagram showing a boundary scan chain.
Figure 5:
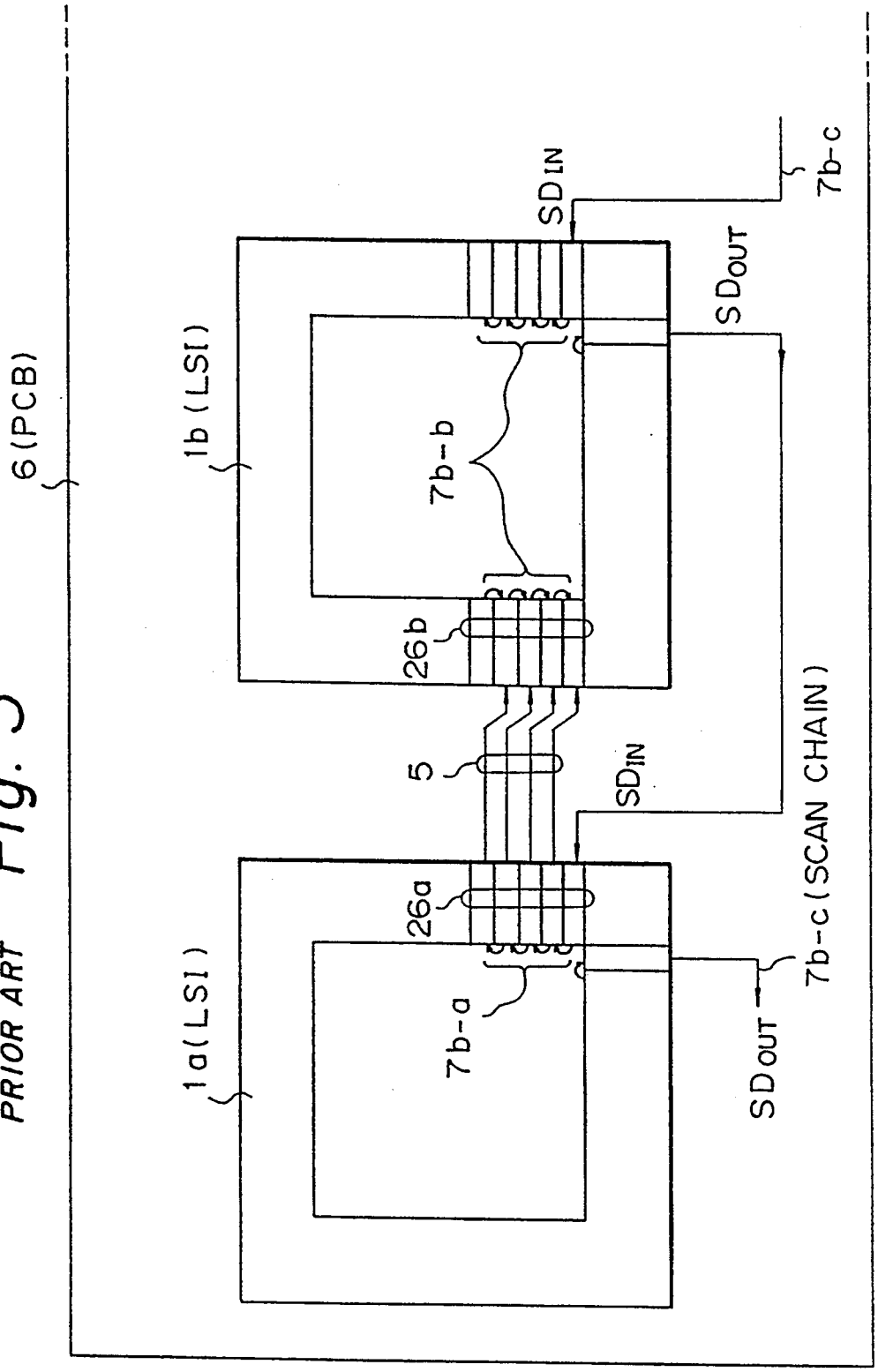
FIG. 5 is a diagram showing a boundary scan chain.
Figure 6:
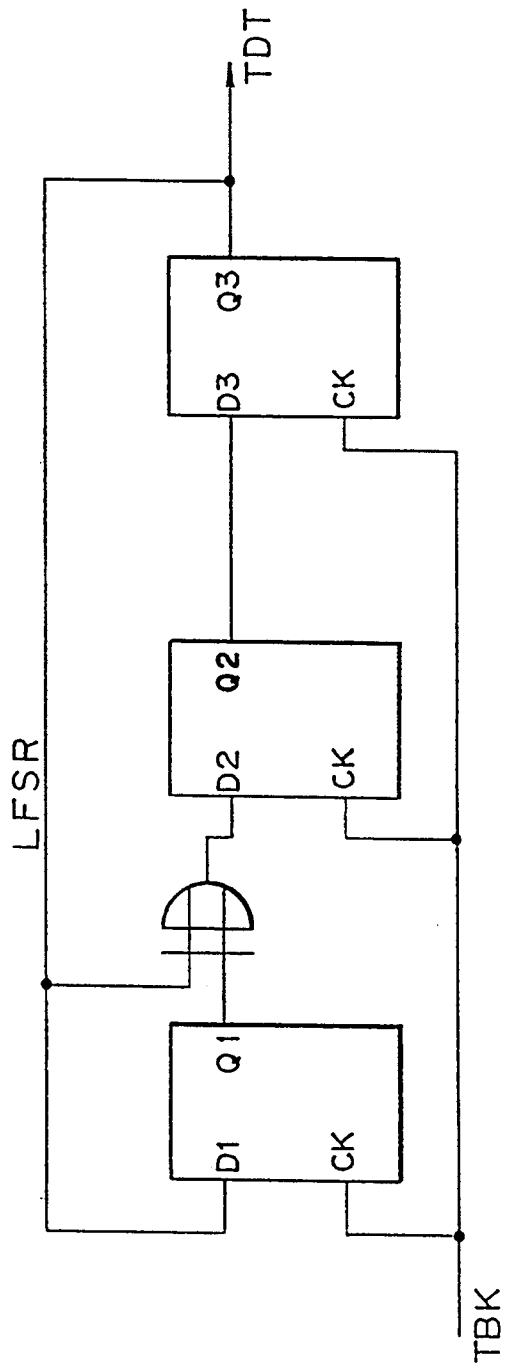
FIG. 6 is a simplified circuit diagram showing a pseudo-random pattern generator.

An example of "101010" for a scan-in data SD$_{IN}$ is illustrated in FIG. 6 (i.e., FIG. 6 shows a circuit of the scan data generator). By employing a linear feedback shift register LFSR, a pseudo random pattern can be produced.

Figure 7:
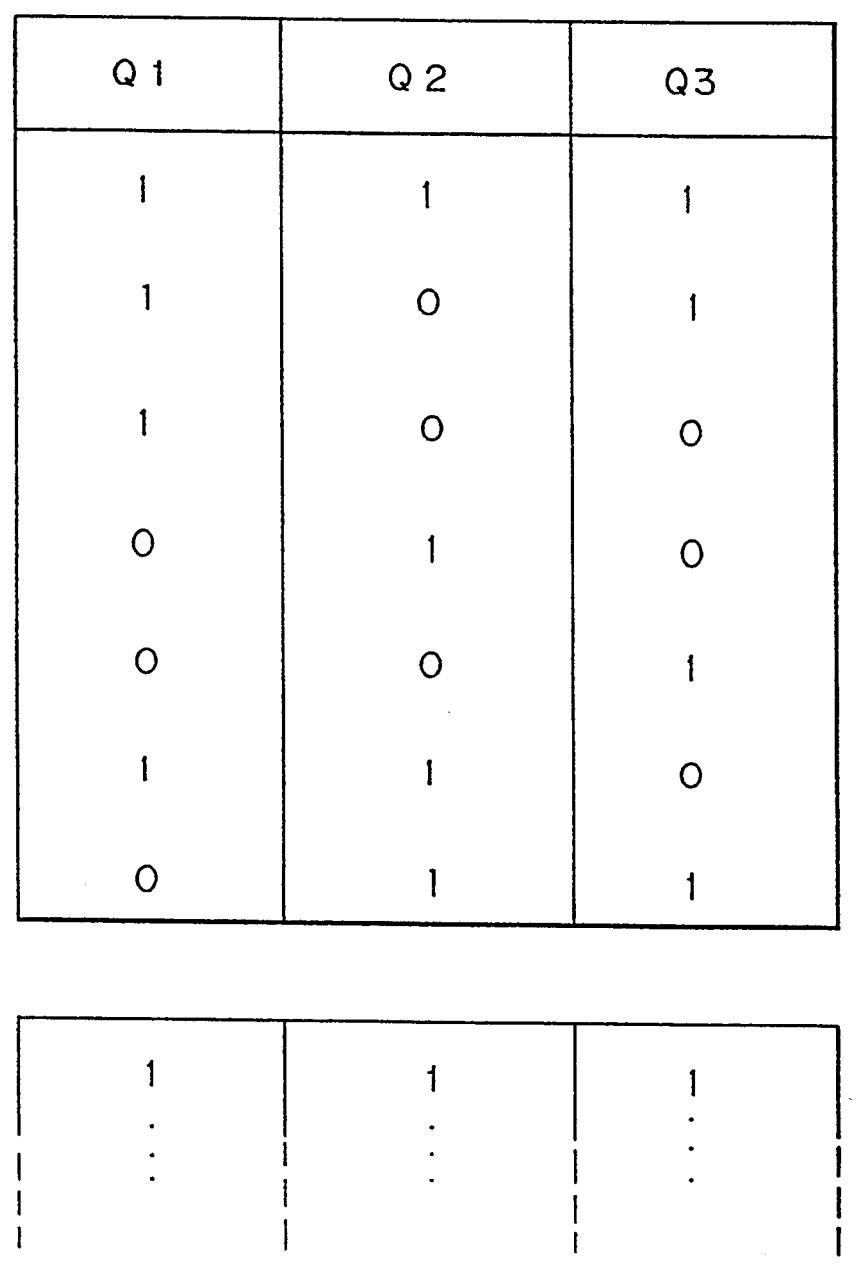

FIG. 7 is a diagram showing an output state (Q1, Q2 and Q3) of each flip-flop in a pseudo-random pattern generation circuit in FIG. 6, the circuit of which repetitively outputs a Q3 state as a pseudo-random pattern TDT.

With regard to the present invention, if no AC signal is delivered externally an input pin for testing is set to a predetermined DC level, a dynamic burn-in test can be implemented. As a result, a burn-in board may be simply configured and the limitation of a terminal arrangement is not necessary except for an input pin for testing, so that an internal circuit including a self-contained memory can easily be operated at a desired frequency.

I claim:

1. A semiconductor integrated circuit device comprising:

an internal circuit formed of one of a logical circuit and a functional circuit, and said internal circuit including a memory means which inputs scan data supplied via scan path means as address data;

scan path means connected to said internal circuit, for delivering scan data into said internal circuit;

scan data generation means connected to said scan path means, for generating scan data corresponding to a test mode signal, based on a scan clock output from clock generation means; and clock generation means connected to said scan path means, for generating a scan clock based upon said test mode signal;

wherein said internal circuit, said scan path means, said scan data generation means and said clock generation means are formed in a single chip, and the scan data produced by said scan data generation means is delivered to said scan path means in response to said test mode signal.

2. A semiconductor integrated circuit device according to claim 1, wherein said scan path means comprises a plurality of flip-flops connected to an input terminal and an output terminal of the internal circuit.

3. A semiconductor integrated circuit device according to claim 1, further comprising an input/output circuit which forms an interface with a plurality of external terminals of said internal circuit, and a plurality of flip-flops arranged in a plurality of input/output circuits are connected to each other.

4. A semiconductor integrated circuit device according to claim 3, wherein data is delivered from an input other than a scan-in pin into an LSI through said flip-flop which is self-contained in said input/output circuit; said scan data is transferred serially through said flip-flop and at the same time delivers said scan data into an LSI from all input terminals through said selector.

5. A semiconductor integrated circuit device according to claim 1, further comprises a basic clock generation circuit for generating a clock which activates said scan data generation means and said clock generation means.

6. A semiconductor integrated circuit device according to claim 5, wherein said basic clock generation circuit includes a ring oscillator.

7. A semiconductor integrated circuit device according to claim 5, wherein said scan data generation means produces random pattern data, based upon a clock output from said basic clock generation circuit.

8. A semiconductor integrated circuit device according to claim 5, wherein said scan data generation means is formed by a counter circuit and produces pattern data which is repeatedly inverted based on said clock output from said basic clock generation circuit.

9. A semiconductor integrated circuit device according to claim 1, wherein said semiconductor integrated circuit device further comprises an input circuit for a scan-in operation, said input circuit delivers scan test data and clocks delivered from externally in the case of a scan test, to said scan path means, and further includes a selector in said input circuit for a scan-in operation, said selector being activated such that it delivers scan test data supplied to an external terminal in the case of a scan test to said scan path means and delivers data for scanning produced from said scan data generation means and clocks for scanning produced said clock generation means based on said test mode signal in the case of a burn-in operation, to said scan path means.

10. A semiconductor integrated circuit device according to claim 1, wherein said memory means is a synchronous memory circuit which is activated in response to a scan clock delivered from said clock generation means.

* * * * *